United States Patent [19]

Narahara

[11] Patent Number: 5,331,588
[45] Date of Patent: Jul. 19, 1994

[54] SEMICONDUCTOR MEMORY DEVICE
[75] Inventor: Tetsuya Narahara, Tokyo, Japan
[73] Assignee: NEC Corporation, Tokyo, Japan
[21] Appl. No.: 604,280
[22] Filed: Oct. 29, 1990
[30] Foreign Application Priority Data Oct. 27, 1989 [JP] Japan .................................. 1-281275

[51] Int. Cl.$^5$ .............................................. G11C 5/02
[52] U.S. Cl. ...................................... 365/51; 365/63; 365/189.01
[58] Field of Search ...................... 365/51, 63, 189.01, 365/205, 207, 208

[56] References Cited
U.S. PATENT DOCUMENTS 4,710,789 12/1987 Furutani et al. ................. 365/51 X
4,896,294 1/1990 Shimizu et al. ..................... 365/63

Primary Examiner—Joseph A. Popek
Attorney, Agent, or Firm—Sughrue, Mion, Zinn, Macpeak & Seas

[57] ABSTRACT

Out of a plurality of digit lines consisting of first layer aluminum wirings that are connected respectively to a plurality of memory cells forming a memory cell array region, and sense amplifiers that have the digit lines selected by Y selector circuits as the inputs are arranged in the direction of the digit lines of the memory cell array region. At least a part of the wirings between the plurality of the digit lines and the sense amplifiers are disposed as second layer aluminum wirings on the memory cell array region. By so arranging it is possible to provide sophisticated sense amplifiers in a semiconductor memory device which has a large number of output bits and yet a high speed operation is required for it.

17 Claims, 11 Drawing Sheets

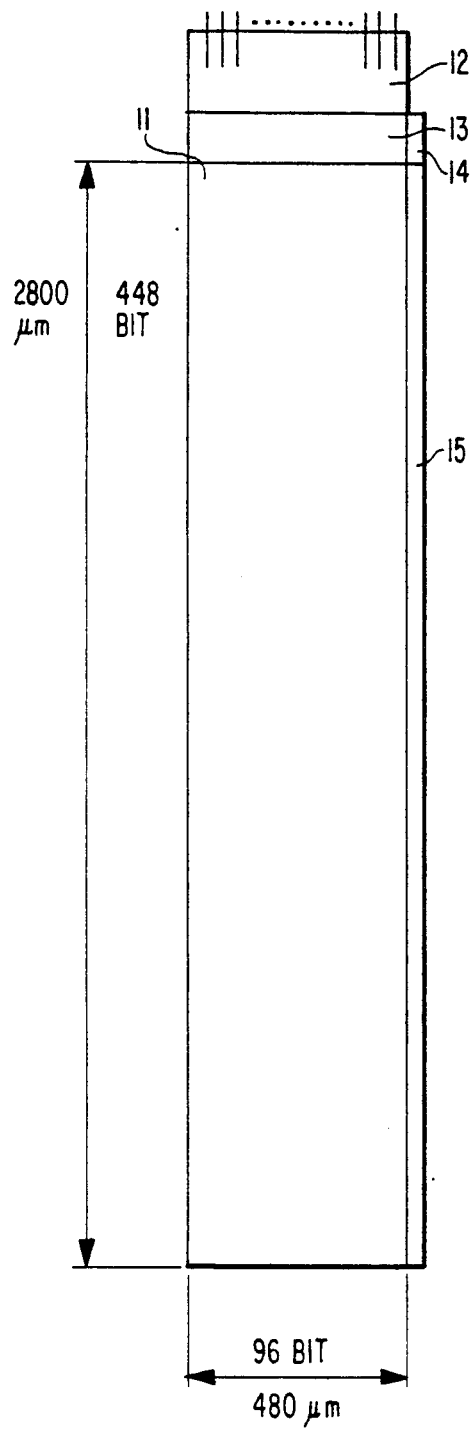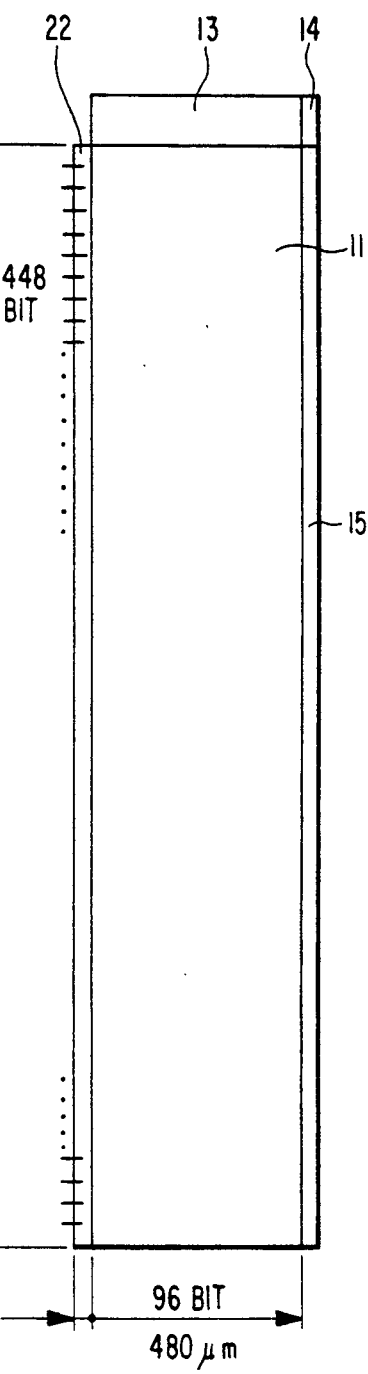

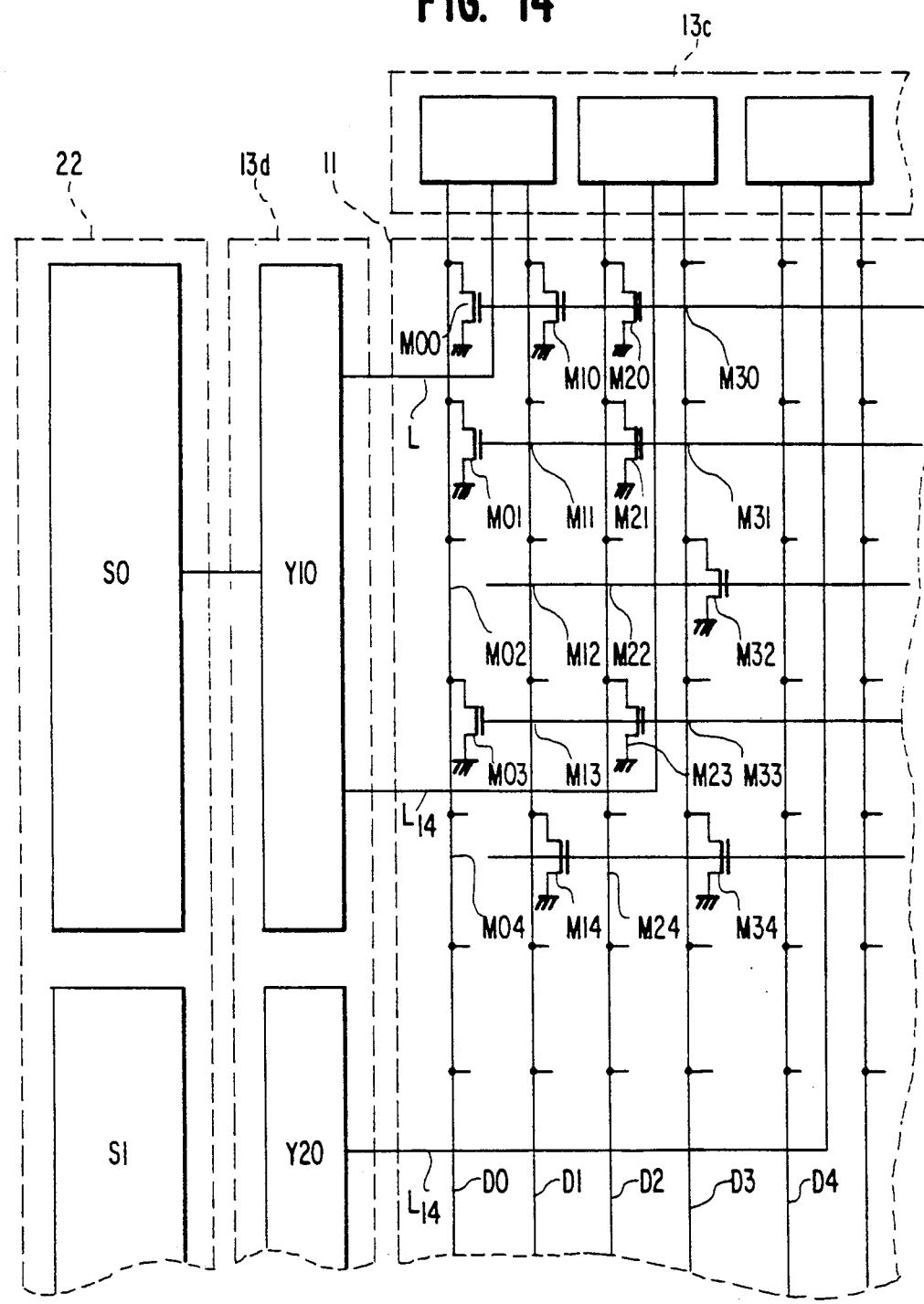

SEMICONDUCTOR MEMORY DEVICE

BACKGROUND OF THE INVENTION

1. Field of the Invention

The present invention relates to a semiconductor memory device, and more particularly to the wiring of sense amplifiers and the like of a semiconductor memory device.

2. Description of the Prior Art

A semiconductor memory device has in general a memory cell array region formed by arranging memory cells with digit lines and word lines connected thereto in an array form. In the direction parallel to the digit lines of the memory cell array region there are provided X decoders that are connected to the word lines, and in the direction parallel to the word lines there are provided Y selectors and sense amplifiers that are connected to the digit lines.

In such a semiconductor memory device, a word line is formed of polycrystalline silicon with a relatively high resistance value (about 20 $\Omega$/square). Consequently, the length of the word lines has to be made as short as possible in designing a memory with high speed. A method of diminishing the length of the word lines is to reduce the number of digit lines in order to decrease the length in the direction of the word lines within the memory cell array region. In accordance with this method, the number of the memory cells that are connected per digit line is increased by augmenting the length of the digit lines in proportion to the degree of reduction in the number of the digit lines.

Among memories for which high speed is required, in a memory with a large number of output bits such as a micro ROM that is storing micro codes and a cache memory the number of the sense amplifiers becomes large corresponding to the number of the output bits. Since the sense amplifier circuits are formed in the direction of the word lines of the memory cell array region, as mentioned above, which becomes narrow by the aforementioned arrangement, the available width of the formation per sense amplifier circuit becomes small.

In short, in a memory device which requires high speed and has a large number of output bits, the width of the region for forming the sense amplifiers is narrow so that there is a drawback in that it is not possible to obtain a complicated circuit with large number of elements, namely, a sophisticated sense amplifier circuit.

BRIEF SUMMARY OF THE INVENTION

Object of the Invention

Therefore, it is the object of the present invention to provide a semiconductor memory device, requiring a high speed of operation and yet having a large number of output bits, which enables to obtain sophisticated sense amplifier circuits.

Summary of the Invention

The semiconductor memory device of the present invention has a memory cell array area consisting of a plurality of memory cells arranged in an array form, a region in which Y selector circuits that input a predetermined number of digit lines out of digit lines connected respectively to a plurality of memory cells and a region where sense amplifiers connected to the output terminals of the Y selectors arranged on a virtual extension of a plurality of word lines connected respectively to a plurality of memory cell arrays. The digit lines are made of a first layer of high melting point metallic wirings, and at least a part of the wirings that connect the digit lines, the Y selector circuits and the sense amplifiers is arranged on the memory cell array region and are made of second high melting point metallic wirings.

For the high melting point metallic wirings use is made of aluminum, gold, tungsten or the like.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 1 shows an overall configuration of the conventional semiconductor memory device;

FIG. 6 shows a first embodiment of the semiconductor memory device of the present invention;

FIG. 14 shows a fourth embodiment of the semiconductor memory device of the present invention.

DETAILED DISCUSSION OF THE INVENTION

Figure 2:
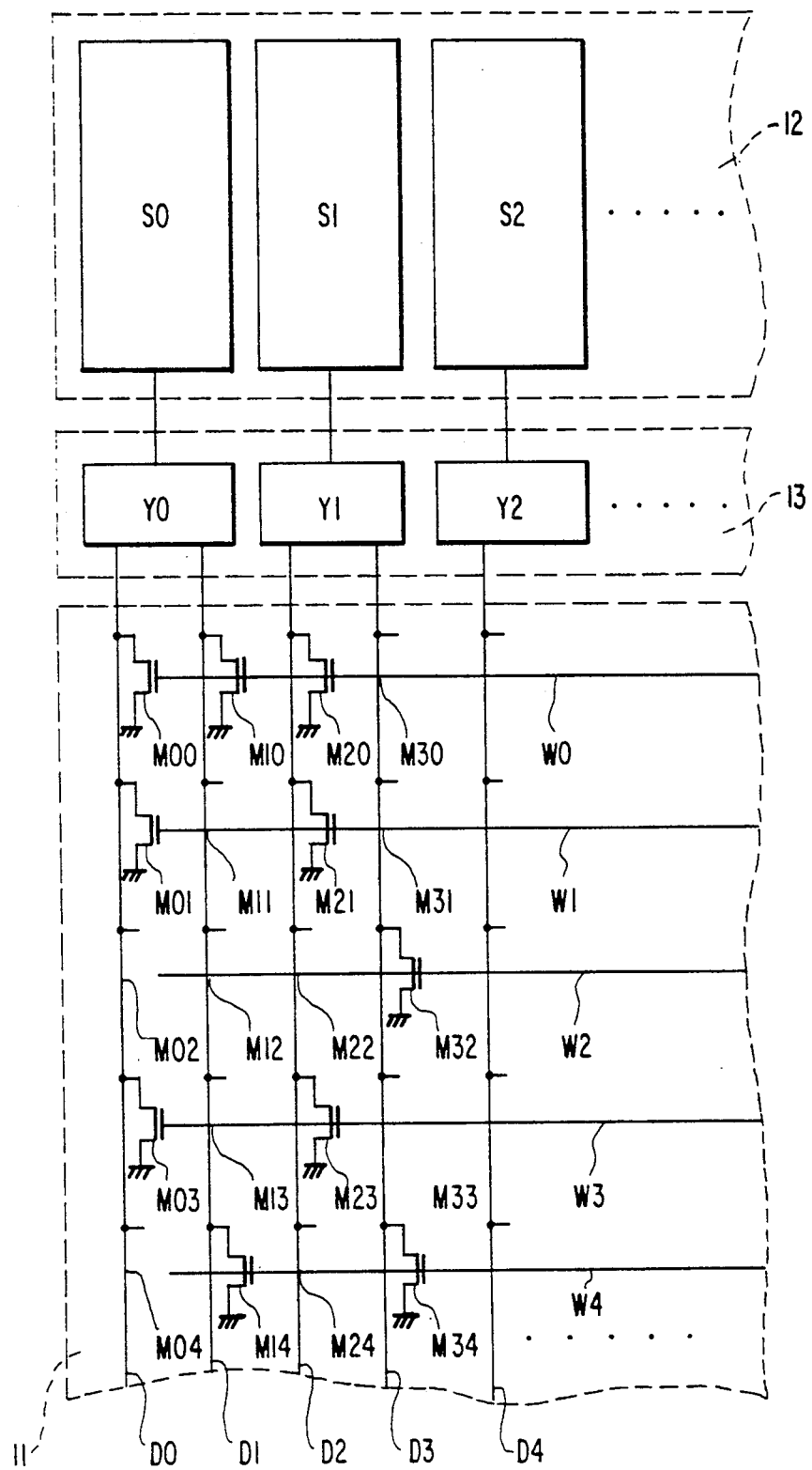
FIG. 2 illustrates a part of each of the sense amplifier part, the Y selector part and the memory cell array part shown in FIG. 1.

Prior to proceeding to the description of the embodiments of the present invention a brief explanation of the conventional semiconductor memory device is in order.

FIG. 1 shows the constitution of a 448×96 bit mask ROM portion with 48-bit outputs that exists within a one-chip micro-computer. In this mask ROM the word lines that have high resistance are given shorter lengths for the purpose of enhancing the operating speed. In other words, the number of the digit lines is reduced and correspondingly the length of one line of the digit line is increased so as to realize a configuration in which the number of the memory cells connected per digit line is augmented. More specifically, the length of the memory cell array region 11 in the direction of the word lines (referred to as the transversal direction hereinafter) is 480 $\mu$m, and 96 digit lines consisting of wirings of aluminum whose resistance is negligible compared with that of polycrystalline silicon are provided within the width mentioned above. In contrast, the length in the direction of the digit lines (referred to as the longitudinal direction hereinafter) of the memory cell array region 11 is 2800 μm, and within that width there are provided 448 word lines consisting of polycrystalline silicon.

In general, the Y selector region 13 and the sense amplifier region 12 are provided in the direction parallel to the word lines of the memory cell array region 11 on the extensions of the digit lines. Accordingly, in a memory with many output bits as in this case, there must be formed sense amplifiers corresponding to the number of the output bits in the narrow width. In this example, 48 sense amplifier circuits have to be formed within the width of 480 μm so that the width per sense amplifier circuit becomes 10 μm. Further, the Y decoder region 14 which supplies selective signals to the Y selectors is provided adjacent to the Y selectors, and the X decoder region 15 which selects the word lines is provided in the direction parallel to the digit lines on the extensions of the word lines.

FIG. 2 is the circuit diagram which shows a part of each of the sense amplifier region 12, the Y selector region 13 and the memory cell array region 11 shown in FIG. 1. In the memory cell array region 11, there are provided a plurality of MOS transistors (M00, M01, ...) acting as memory cells between the grounding potential and the respective digit lines (D0, D1, ..., D95) consisting of aluminum wirings, and the gates of the transistors are connected to word lines (W0, W1, ..., W447) consisting of polycrystalline silicon. In the Y selector region 13, there is provided respectively one Y selector (out of Y0, Y1, ...) for two digit lines (D0 and D1, D2 and D3, ...), and in the sense amplifier region 12 there is connected respectively one sense amplifier (S0, S1, ...) to one output of the Y selector (Y0, Y1, ...).

Figure 3:
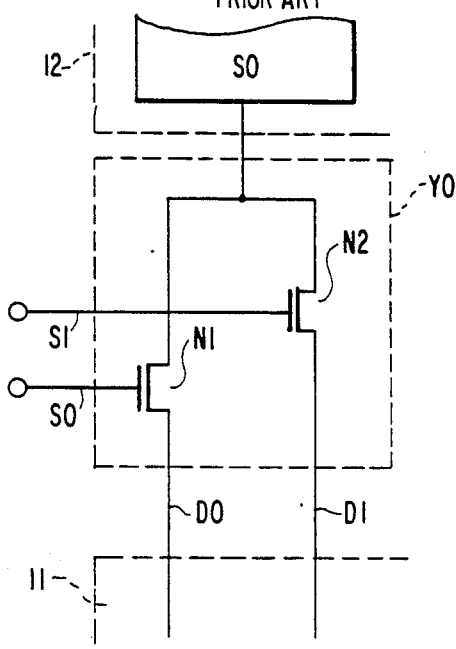
FIG. 3 illustrates the circuit configuration of the Y selector shown in FIG. 2.
Figure 4:
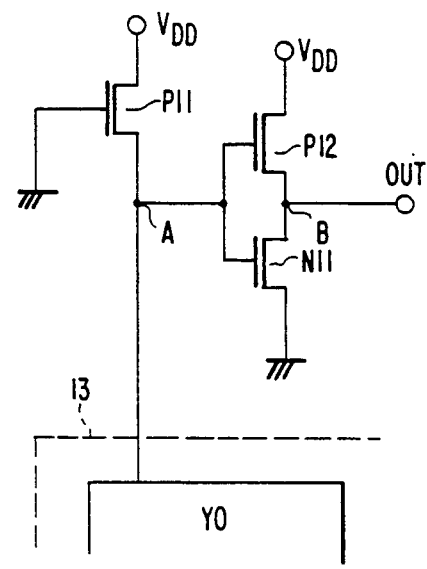
FIG. 4 illustrates the circuit configuration of the sense amplifier shown in FIG. 2.

FIG. 3 and FIG. 4 are circuit diagrams showing specific circuit configurations for the Y selector and the sense amplifier shown in FIG. 2.

Referring to FIG. 3, the Y selector Y0 consists of N-channel MOS transistors N1 and N2 which are turned on and off by the selection signals supplied by the selection signal lines S0 and S1 from the Y decoder (FIG. 1). By means of the selection signal either of the two digit lines D0 and D1 is connected to the sense amplifier S0.

Referring to FIG. 4, a sense amplifier consists of a P-channel transistor P11 whose gate is connected to the grounding potential and whose source and drain path is connected between a node A and a voltage supply terminal $V_{DD}$, and an inverter formed by a P-channel transistor P12 and an N-channel transistor N11 whose gates are connected commonly to the node A, and the output line of the Y selector Y0 is connected to the node A. In addition, the output node B of the inverter is connected to the output terminal OUT of the sense amplifier.

In this sense amplifier, its output level is determined accordingly as the level of the selected digit line is the $V_{DD}$ level or the grounding level. In a digit line there exists a large capacitance C that consists of a junction capacitance of the memory cells connected and a wiring capacitance. Accordingly, if the selected memory cell on the digit line is in the on-state, the voltage of the digit line is lowered to the grounding level by discharging the electricity that is charged on the capacitor C, and if the memory cell is in the off-state, the voltage of the digit line is raised to the $V_{DD}$ level by charging up the capacitor C using the P11 of the sense amplifier.

Figure 5:
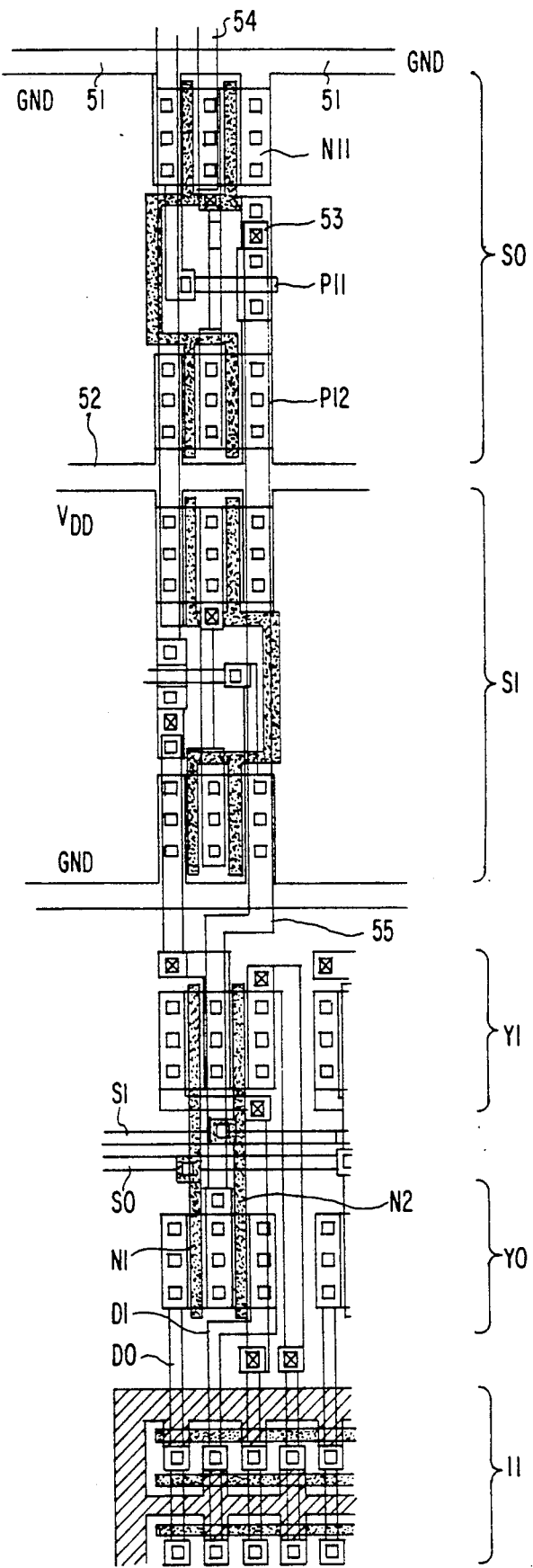
FIG. 5 illustrates the pattern configuration of the parts shown in FIG. 2.

FIG. 5 is a plan view that shows the pattern configuration of the parts shown in FIG. 2 to FIG. 4. In the figure, the components identical to those in FIG. 2 to FIG. 4 are assigned identical numerals. As mentioned above, this mask ROM has to form 48 sense amplifier circuits within the transversal length of 480 μm so that the width available per sense amplifier circuit is 10 μm. However, this width is insufficient for forming elements that constitute a sense amplifier. For this reason, in reality the two sense amplifiers S0 and S1 are stacked so as to obtain the effective width for one sense amplifier of 20 μm.

In constructing a sense amplifier within a small width of 20 μm, the types of circuit that can be constructed and the configuration of the elements that constitute the circuit will have to be restricted. For instance, for the sense amplifier S0 it is only possible to form a simple circuit with a small number of component elements as indicated in FIG. 4. Moreover, the only realizable configuration of the elements for this circuit is to stack one after another the P-channel transistor P11, and the P-channel transistor P12 and the N-channel transistor N11 that constitute the inverter. Here, the supply of the grounding potential GND and the voltage supply $V_{DD}$ is accomplished by means of first layer aluminum wirings 51 and 52, respectively, while the wiring among the three transistors, the output wiring and the input wiring from the selector Y0 are accomplished by means of second layer aluminum wirings layers 53, 54 and 55, respectively.

The Y selector is formed by analogously stacking Y0 and Y1. For example, in the Y selector Y0, the selection signal S0 is connected to the gate of the N-channel transistor N1 that is connected to the digit line D0 of the memory cell array region 11, and the selection signal S1 is connected to the gate of the N-channel transistor N2 that is connected to the digit line D1, with the conduction of each path being controlled. Selected digit line is connected to the sense amplifier S0 by the second layer aluminum wiring 55.

As described in the above, in the conventional semiconductor memory device which requires high speed and yet has a large number of output bits, the available width of the formation area per sense amplifier circuit becomes small, so that it is only possible to form a simple sense amplifier circuit with small number of component elements as shown, for example, in FIG. 4. In such a simple circuit, performance such as the reading speed is deteriorated, and as a result, there is a drawback in that it is unable to achieve high speed of a semiconductor memory device as a whole.

Next, referring to FIG. 6 through FIG. 14, the embodiments of the present invention will be described.

FIG. 6 is a diagram showing the configuration of the semiconductor memory device which is the first embodiment of the present invention which is a mask ROM with 48-bit outputs and 448×96 bit constitution that exists within a one-chip microcomputer. The dimensions of the memory cell array area 11 of the present embodiment are the same as those of the memory cell array region in FIG. 1. That is, the length of the transversal direction of the memory cell array region is 480 μm with 96 digit lines provided within that width, and the length of the longitudinal direction is 2800 μm with 448 word lines provided within that width.

Figure 7:
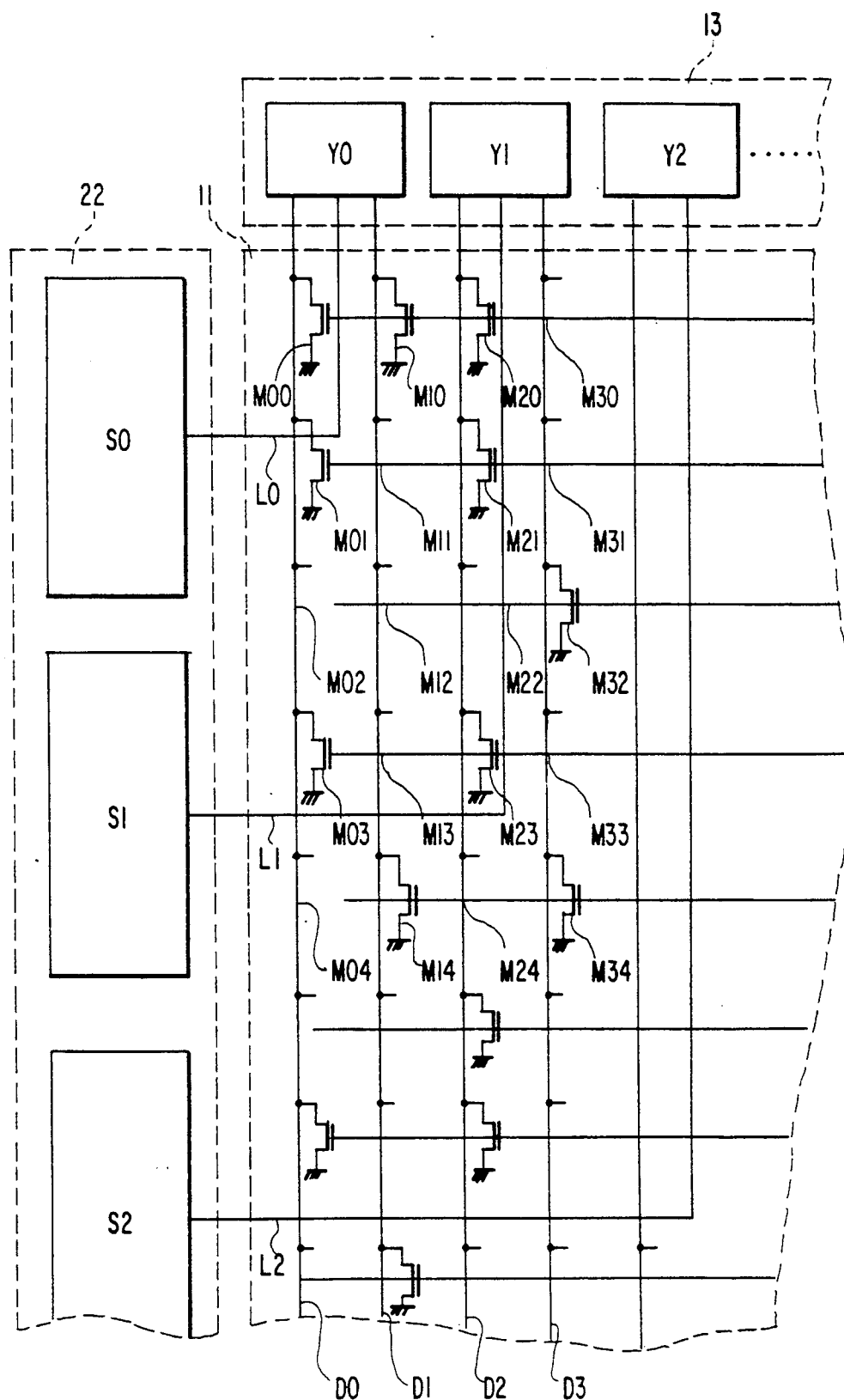
FIG. 7 illustrates a part of each of the sense amplifier part, the Y selector part and the memory cell array part shown in FIG. 6.

Generally, the memory cell array region 11 uses the first layer aluminum wirings for the digit lines as shown in FIG. 5. However, the second layer aluminum wirings do not exist in the memory cell array formation region. Under these circumstances, the present inventors acknowledged that by disposing the second layer aluminum wirings on the memory cell array, and disposing a sense amplifier region 22 in the direction parallel to the longer side of the memory cell array region 11 on the extensions of the word lines so as to have the same length as the longitudinal direction (2800 μm) of the memory cell array region 11, it is possible to give a margin to the available width per sense amplifier circuit and construct sophisticated sense amplifiers. Referring to FIG. 7, the situation will be described in more detail. In this connection, it should be mentioned that other areas of the present embodiment, namely, the Y selector region 13, the Y decoder region 14 and the X decoder region 15 are arranged in the same way as in the prior art shown in FIG. 1.

FIG. 7 is the circuit diagram showing a part of each of the sense amplifier region 22, the Y selector region 13 and the memory cell array region 11 shown in FIG. 6. Each of the Y selectors (Y0, Y1, ...) selects either of each pair of digit lines (D0 and D1, D2 and D3, ...) by a selection signal (not shown) from the Y decoder region 14 (FIG. 1) by inputting the digit lines formed of the first layer aluminum wirings. The wirings (L0, L1, ...) from the Y selectors (Y0, Y1, ...) to the sense amplifiers (S0, S1, ...) are disposed in the memory cell array region 11 by the use of the second layer aluminum wirings. With this arrangement, it was possible to arrange the sense amplifiers (S0, S1, ...) along the longitudinal length of the memory cell array region 11. Accordingly, by providing all of the wirings between the Y selectors and the sense amplifiers with the second layer aluminum wirings on the memory cell array area 11, the sense amplifier region 22 was able to be disposed along the longitudinal direction of the memory cell array region 11.

In the present embodiment, the length in the longitudinal direction of the memory cell array region 11 is 2800 μm, and 48-bit outputs, namely, 48 sense amplifiers exist within the width. In other words, the width of the area for forming one sense amplifier circuit becomes about 55 μm, and it became possible to form a sophisticated sense amplifier circuit with a large number of elements in the region.

Figure 8:
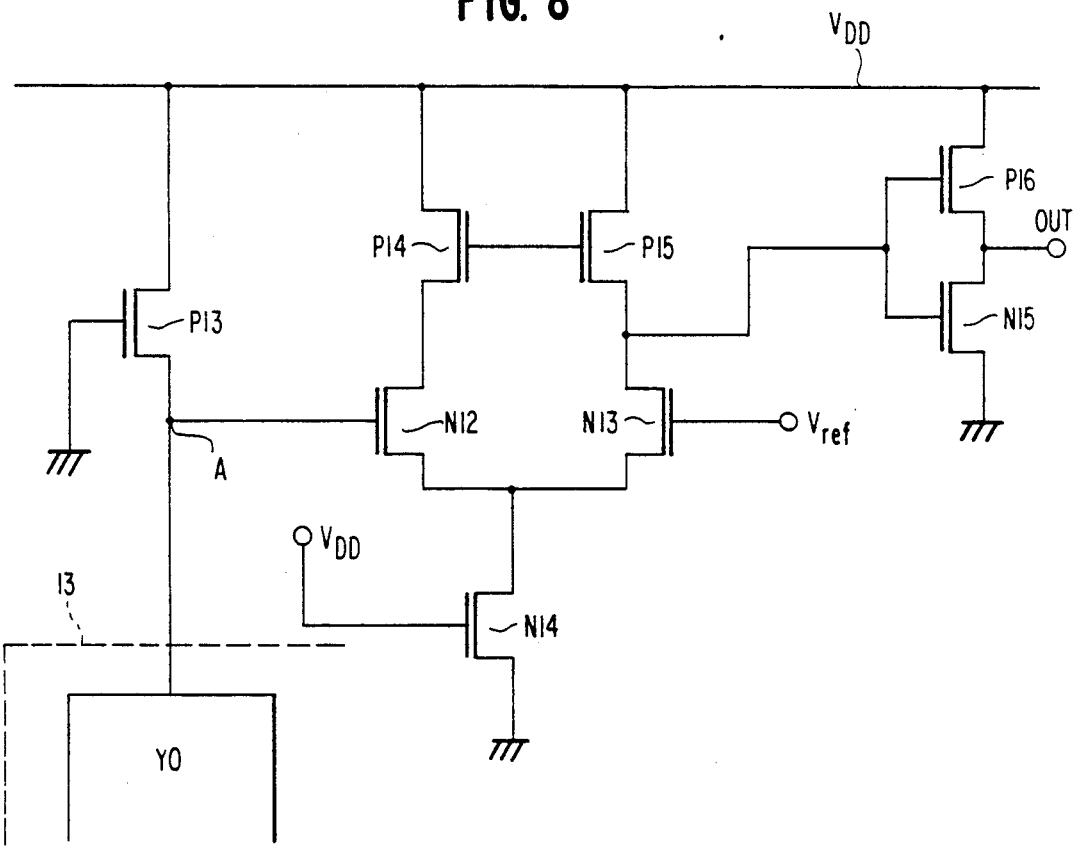
FIG. 8 illustrates the circuit configuration of the sense amplifier shown in FIG. 7.

FIG. 8 shows an example of a specific circuit configuration of the sense amplifier circuits (S0, S1, ...) formed in the sense amplifier region 22. A differential amplifier circuit is constructed by P-channel transistors P14 and P15, and N-channel transistors N12, N13 and N14. One of the input terminals of the differential amplifier circuit is connected to the node A which is connected to a digit line selected by the Y selector, and the other input terminal receives a reference voltage Vref. The output of the differential amplifier circuit is connected to the input terminal of an inverter consisting of a P-channel transistor P16 and an N-channel transistor N15, and the output of the inverter is connected to the output terminal OUT of the inverter.

With such a circuit configuration, the output of the inverter is inverted when the potential of the node A becomes equal to the reference voltage Vref. That is, the output of the inverter can be inverted for a small potential change in the digit line connected to the node A by setting the value of the reference voltage Vref at an appropriate level, whereby making it possible to improve the speed of the sense amplifier. It is to be noted that the circuit configuration of the Y selector is the same as the circuit configuration in FIG. 3.

Figure 9:
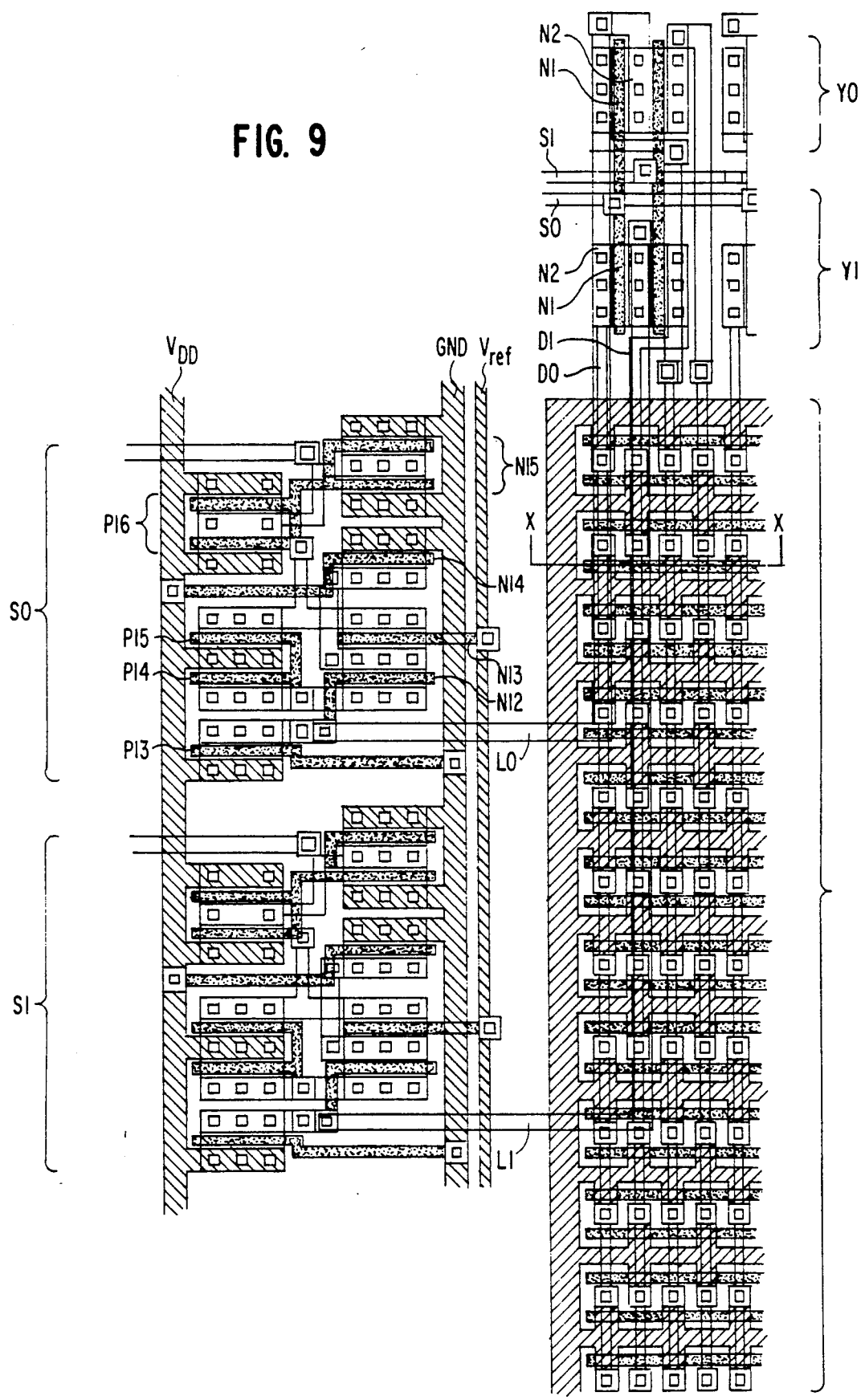
FIG. 9 illustrates the pattern constitution of the parts shown in FIG. 7.

FIG. 9 is a plan view showing the pattern constitution of the parts shown in FIG. 7 and FIG. 8. Components in FIG. 8 identical to those in FIG. 7 and FIG. 8 are assigned identical reference numerals.

The Y selectors (Y0, Y1, ...) are given the same pattern constitution as that of the conventional selectors shown in FIG. 5, with Y0 and Y1 being formed in stacked fashion. In the Y selector Y0, for example, digit lines D0 and D1 made of the first layer aluminum wirings provided in the memory cell array region 11 are connected to the N-channel transistors N1 and N2, respectively. The selection signal lines S0 and S1 are connected to the gates of the two transistors to control their energization.

The selected digit line is connected to the sense amplifier S0 that is arranged along the longitudinal direction of the memory cell array region 11 by means of the second layer aluminum wiring L0 arranged on the memory cell array region 11.

A sense amplifier is formed in a region with a longitudinal and a transversal lengths of about 55 μm. In the sense amplifier S0, for example, P-channel transistors P14 and P15 and N-channel transistors N12, N13 and N14 that constitute the differential amplifier circuit and a P-channel transistor P16 and an N-channel transistor N15 that constitute the inverter circuit are arranged within a nearly square region.

Figure 10:
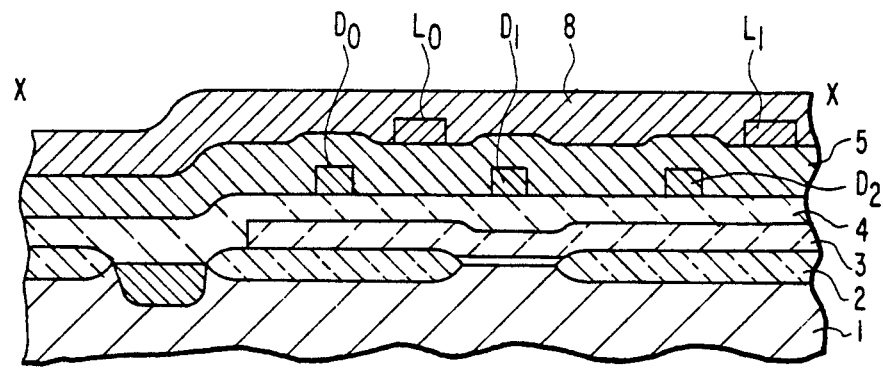
FIG. 10 illustrates the sectional part along line X—X shown in FIG. 9.

FIG. 10 is a sectional view taken along the line X—X in FIG. 9. Polycrystalline silicon 3 which is a word line is arranged on an element isolation region 2 formed on a substrate 1. In the manner to cross polycrystalline silicon 3 orthogonally there are disposed digit lines (D0, D1, ...) via a first interlayer insulating film 4. Furthermore, the second layer aluminum wirings (L0, L1, ...) are formed above the digit lines via a second interlayer insulating film 5.

As described above, in accordance with the present embodiment, it became possible to arrange the sense amplifier region 22 along the length in the longitudinal direction (2800 μm) of the memory cell array region, by disposing the second layer aluminum wirings over the memory cell array region. Accordingly, the width of about 55 μm becomes available for the formation region per sense amplifier circuit which leads to the possibility of constituting a sophisticated sense amplifier. In other words, it became possible to improve the speed of the semiconductor memory device as a whole.

Figure 11:
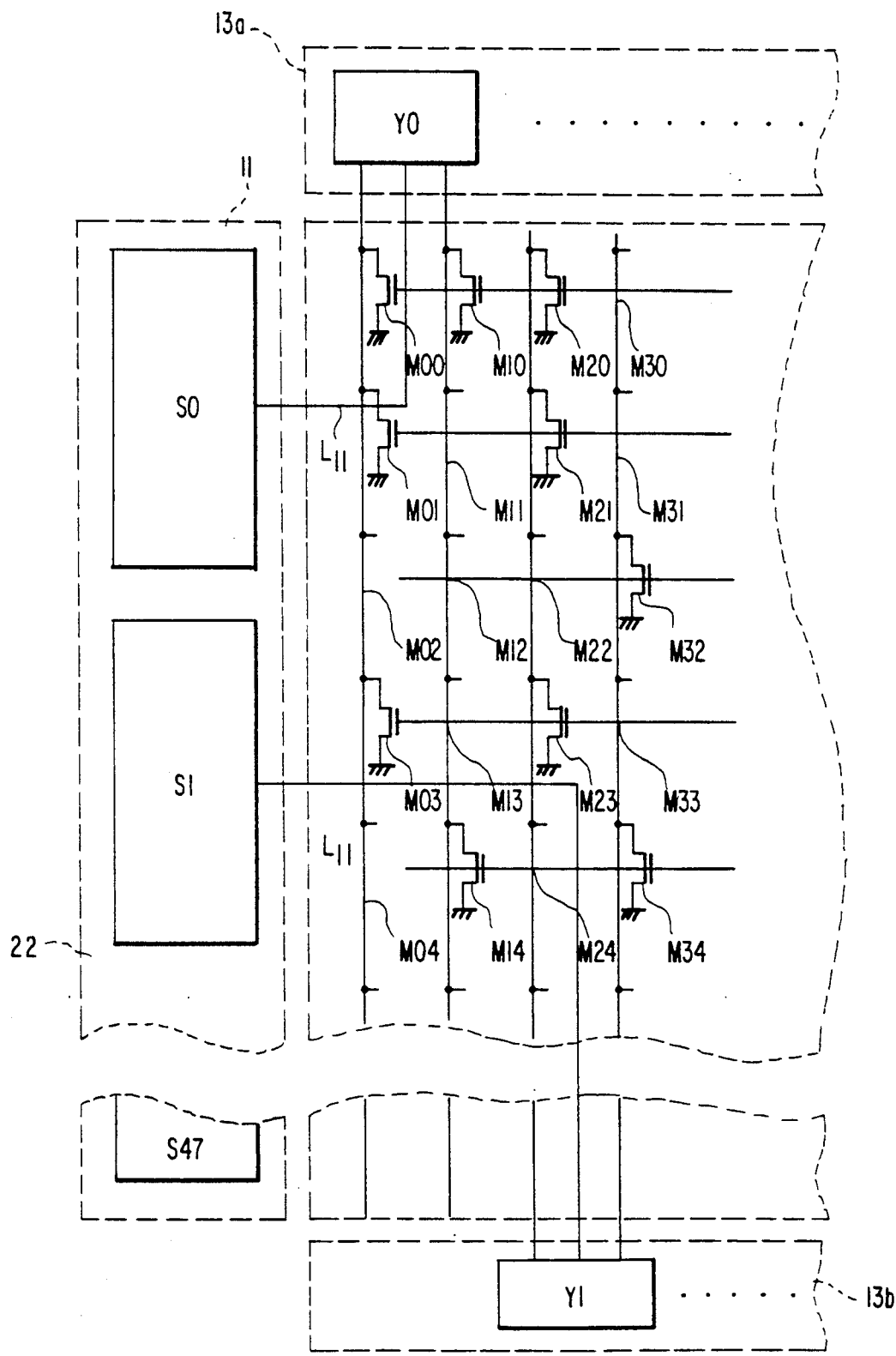
FIG. 11 shows a second embodiment of the semiconductor memory device of the present invention.

FIG. 11 is the circuit diagram showing the second embodiment of the semiconductor memory device of the present invention. In the present embodiment the Y selector formation region is subdivided into two parts of 13a and 13b that are provided in the direction of the word lines of the memory cell array region 11 on the mutually opposing sides with the memory cell array region 11 in between. Each of the Y selectors (Y0, Y1, ...) are connected to the corresponding sense amplifier in (S0, S1, ...) by the second layer aluminum wiring L11 disposed on the memory cell array region 11.

With such a construction, the width of the formation region per Y selector can be doubled, in addition to being able to obtain the same effect as in the first embodiment, so that it becomes possible to obviate the necessity for stacking the Y selectors Y0 and Y1, for example, thereby providing an effect to permit the arrangement of the Y selectors with a margin.

Further, it becomes possible to minimize the total length of the second layer aluminum wirings from the Y selectors to the sense amplifiers by arranging in the Y selector formation region 13a the Y selectors (Y0, Y1, . . . , Y23) that correspond to the sense amplifiers S0 through S23, and arranging (not shown) in the Y selector formation region 13b the Y selectors (Y24, Y25, . . . , Y47) that correspond to the sense amplifiers S24 through S47.

Figure 12:
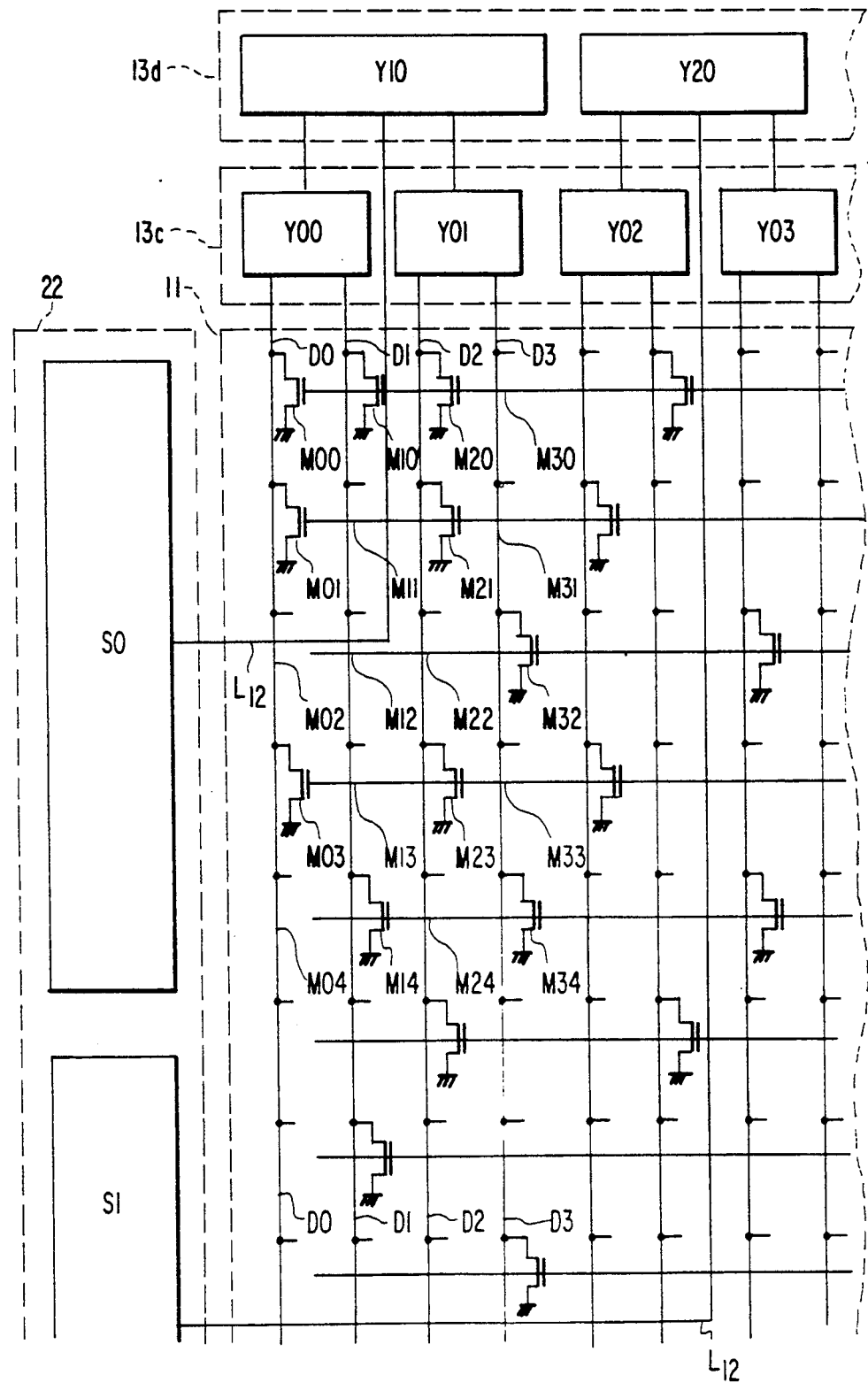
FIG. 12 shows a third embodiment of the semiconductor memory device of the present invention.

FIG. 12 is the circuit diagram showing the third embodiment of the semiconductor memory device of the present invention. In the present embodiment, one more stage of Y selectors are added to the Y selectors of the first embodiment shown in FIG. 7 to obtain a two-stage construction consisting of a first stage Y selectors 13c and a second stage Y selectors 13d. In other words, the digit lines D0 and D1 are selected by a Y selector Y00, the digit lines D2 and D3 are selected by a Y selector Y01, and the outputs of Y00 and Y01 are selected by a Y selector Y10. The output lines L12 of the second stage Y selectors (Y10, Y20, . . . ) are connected to the sense amplifiers (S0, S1, . . . ) passing over the memory cell array region 11.

Figure 13:
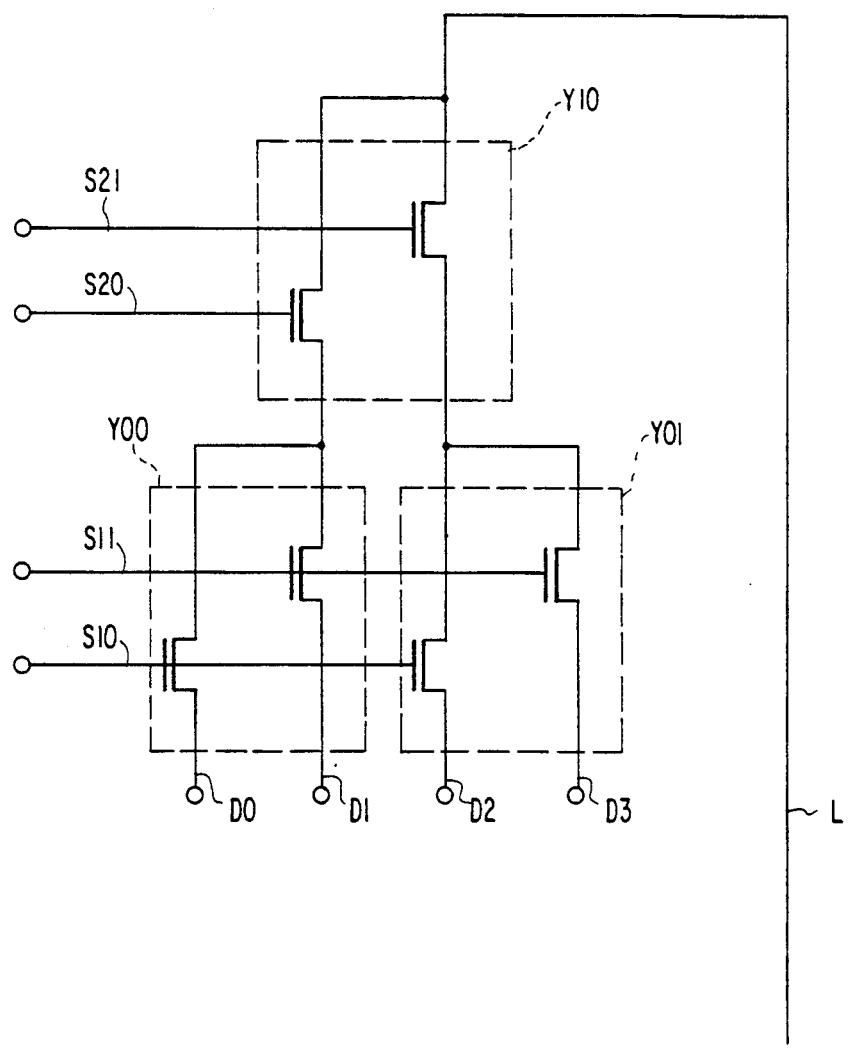
FIG. 13 illustrates the circuit configuration of first and second Y selectors shown in FIG. 12.

FIG. 13 is the circuit diagram showing a specific example of the circuit configuration of the two-stage construction shown in FIG. 12. The first stage Y selectors Y00 and Y01 respectively select either of the digit lines D0 and D1, and D2 and D3 by the selection signals S10 and S11, and the second stage Y selectors an output of either of Y00 and Y01 by the selection signals S20 and S21.

With such a configuration, it is possible to reduce the number of the sense amplifiers, and the width of the formation region per sense amplifier is further increased. In other words, in the present embodiment, for four digit lines (D0, D1, D2 and D3), for example, there is only one sense amplifier S01, so that the total number of the sense amplifier circuits can be reduced to one half, which is 24. Accordingly, the width of the sense amplifier formation region becomes twice as large so that it becomes possible to construct still more sophisticated sense amplifiers.

FIG. 14 is the circuit diagram showing the fourth embodiment of the semiconductor memory device of the present invention. The present embodiment has a construction in which the second stage Y selectors 13c (Y10, Y20, . . . ) of the third embodiment shown in FIG. 12 are arranged along the longitudinal direction of the memory cell array region 11 in parallel to the sense amplifier region 22. In the present embodiment, the wirings between the first stage Y selectors 13c and the second stage Y selectors 13d are the second layer aluminum wirings L14 provided over the memory cell array region 11.

With such a configuration, it is possible to obtain an effect similar to that of the third embodiment, and in addition there can be obtained an effect that many stages of Y selectors need no longer be stacked.

Figure 15:
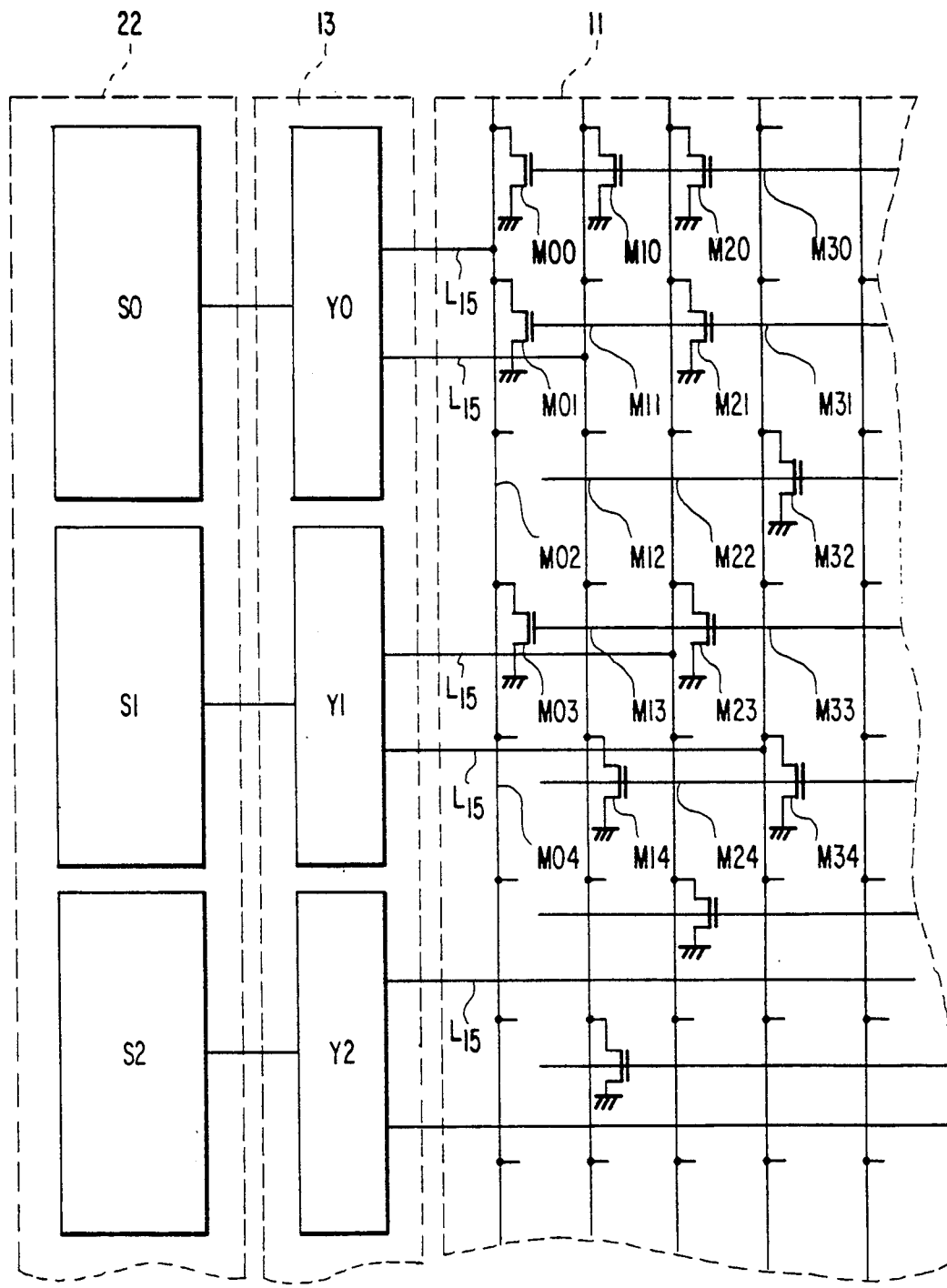
FIG. 15 shows a fifth embodiment of the semiconductor memory device of the present invention.

FIG. 15 is the circuit diagram showing the fifth embodiment of the semiconductor memory device of the present invention. The present embodiment has a construction in which the Y selector region 13 (Y0, Y1, . . . ) of the first embodiment shown in FIG. 7 is arranged along the longitudinal direction of the memory cell array region 11 in parallel with the sense amplifier region 22. In the present embodiment, the wirings that connect the Y selectors 13 to the corresponding digit lines are the second layer aluminum wirings L15 provided over the memory cell array region 11.

With such a configuration, there can be obtained an effect similar to that of the first embodiment, and the width of the Y selector formation region can be increased so that there is obtained an effect that the Y selectors can be arranged with a margin.

Moreover, it is also possible to arrange the Y selectors between the memory cell array region 11 and the sense amplifier region 22 as shown in FIG. 12 and FIG. 14 by giving them a two-stage construction.

In the embodiments described so far, the description has been given by using a mask ROM as an example of the memory cell array. However, the present invention is not limited to the above, and is applicable to memories with a large number of output bits like other ROMs, memories such as a dynamic RAM (DRAM) and a static RAM (SRAM), cache memories, or the like. Accordingly, the types of the sense amplifiers are not limited to those with the circuit configuration shown in FIG. 8 and with the pattern configuration shown in FIG. 9.

Moreover, in the aforementioned embodiments, the second layer metallic wirings to be arranged on the memory cell array region are described as being made of aluminum. In the present invention, however, gold, tungsten or the like in addition to aluminum may be used for the high melting point metallic wirings.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device, comprising:
a memory cell array region having a plurality of memory cells provided in array fashion, including a plurality of digit lines and word lines that are connected respectively to the memory cells, with the number of the word lines being larger than the number of digit lines, each of said digit lines being arranged in a direction perpendicular to each of said word lines to receive data from the memory cells connected to a selected one of said word lines;
selector formation region for forming selector circuits whose input terminals are connected to a predetermined number of digit lines among said plurality of digit lines; and
a sense amplifier formation region for forming sense amplifiers, said sense amplifier formation region being disposed on the extensions of said word lines and stretching in parallel to said digit lines in said memory cell array region to receive through said digit lines the data from the memory cells connected to the selected on of said word lines,
at least a part of a plurality of wirings between said plurality of digit lines and said amplifier formation region being disposed on said memory cell array region.

2. A semiconductor memory device, comprising:
a memory cell array region having a plurality of memory cells provided in array fashion, including a plurality of digit lines and word lines that are connected respectively to the memory cells, with the number of the word lines being larger than the number of the digit lines, a selector formation region for forming selector circuits whose input terminals are connected to a predetermined number of digit lines among said plurality of digit lines; and a sense amplifier formation region for forming sense amplifiers, said sense amplifier formation region being disposed on the extensions of said word lines and stretching in parallel to said digit lines in said memory cell array region, at least a part of a plurality of wirings between said plurality of digit lines and said amplifier formation region being disposed on said memory cell array region;

wherein said semiconductor memory device is constructed with a multilevel wiring structure including a plurality of first-level wirings and a plurality of second-level wirings, said plurality of said digit lines comprising said first-level wirings and said plurality of wirings comprising said second-level wirings.

3. A semiconductor memory device as recited in claim 2, wherein said selector formation region is arranged adjacent to said memory cell array region, and said plurality of wirings are wirings that connect said selector formation region and said sense amplifier formation region.

4. A semiconductor memory device as recited in claim 3, wherein said selector formation region is subdivided into two parts, with the respective formation regions being disposed on the opposite sides with said memory cell array region in between.

5. A semiconductor memory device as recited in claim 2, wherein said selector formation region is given a two-stage configuration.

6. A semiconductor memory device as recited in claim 5, wherein said plurality of wirings are the wirings that connect the second stage selector formation region and said sense amplifier formation region.

7. A semiconductor memory device as recited in claim 5, wherein the second stage selector formation region out of said two-stage configuration selector formation region is disposed on the extensions of said word lines, the first stage selector formation region is disposed in the direction of extensions of said digit lines, and said plurality of wirings are the wirings that connect said first stage selector formation region and said second stage selector formation region.

8. A semiconductor memory device as recited in claim 2, wherein both of said selector formation region and said sense amplifier formation region are disposed on the extensions of said word lines of said memory cell array region, and said plurality of wirings are the wirings that connect said selector formation region and said plurality of digit lines.

9. A semiconductor memory device comprising:

a memory cell array region including a plurality of memory cells arrayed in rows and columns, a plurality of word lines arranged in rows, and a plurality of digit lines arranged in said column, each of said digit lines receiving data from the memory cells connected to a selected one of said word lines and transferring the data in a direction of said column;

a selector circuit having as its inputs a predetermined number of digit lines of the plurality of digit lines connected respectively to plurality of memory cells, for selecting one out of these digit lines;

a plurality of sense amplifiers respectively disposed on the extensions of said word lines arranged in parallel to said digit lines of said memory cell array region, a respective sense amplifier of said plurality of sense amplifiers having the output selected by said selector circuit as the input to receive through said digit line and said selector circuit the data from the memory cell connected to the selected one of said word lines; and wirings between said plurality of digit lines and said sense amplifiers, at least a part thereof being disposed on said memory cell array region.

10. A semiconductor memory device as recited in claim 1 or claim 9, wherein said memory cell array region is a mask ROM.

11. A semiconductor memory device as recited in claim 1 or claim 9, wherein said memory cell array region is an SRAM.

12. A semiconductor memory device as recited in claim 1 or claim 9, wherein said memory cell array region is a DRAM.

13. A semiconductor memory device comprising:

a first area having a memory cell array formed therein, said first area being defined by first and second sides each extending in a first direction and third and fourth sides each extending in a second direction perpendicular to said first direction, said memory cell array including a plurality of word lines arranged in rows in said first direction, a plurality of digit lines arranged in columns in said second direction and a plurality of memory cells disposed respectively at different ones of intersections of said word and digit lines, each of said digit lines receiving data from the memory cells connected to a selected one of said word lines to transfer the data in said second direction; and a second area having a plurality of sense amplifiers formed therein, said second area being disposed on the extensions of said word lines and provided adjacently to and along said third side of said first area and each of said sense amplifiers receiving through the associated one of said digit lines the data from the memory cell connected to the selected one of said word lines.

14. The device as claimed in claim 13, wherein said word lines have a length smaller than that of said digit lines so that each of said third and fourth sides is longer than each of said first and second sides.

15. The device as claimed in claim 14, further comprising a third area having formed therein decoder circuits for said word lines, said third area being provided adjacently to and along said fourth side of said first area.

16. The device as claimed in claim 15, further comprising a fourth area provided adjacent to and along said first side of said first area and a fifth area provided adjacent to and along said second side of said first area, at least one of said fourth and fifth areas including selector circuits for said digit lines.

17. A semiconductor memory device, comprising:

a first area having a memory cell array formed therein, said first area being defined by first and second sides each extending in a first direction and third and fourth sides each extending in a second direction perpendicular to said first direction, said memory cell array including a plurality of word lines arranged in rows in said first direction, a plurality of digit lines arranged in columns in said second direction and a plurality of memory cells disposed respectively at different ones of intersections of said word and digit lines, said word lines having a length smaller than that of said digit lines so that each of said third and fourth sides is longer than each of said first and second sides;

a second area having a plurality of sense amplifiers formed therein, said second area being provided adjacently to and along said third side of said first area;

a third area having formed therein decoder circuits for said word lines, said third area being provided adjacently to and along said fourth said of said first area;

a fourth area provided adjacent to and along said first side of said first area and a fifth area provided adjacent to and along said second side of said first area, at least one of said fourth and fifth areas including selector circuits for said digit lines;

wherein said semiconductor memory device is constructed with a multilevel wiring structure including a plurality of first-level wirings and a plurality of second-level wirings and said sense amplifiers and said selector circuits are connected to each other by a plurality of interconnection lines, said digit lines comprising said first-level wirings and said interconnection lines comprising said second-level wirings.

* * * * *